United States Patent
Butenhoff et al.

(10) Patent No.: US 10,848,148 B2
(45) Date of Patent: Nov. 24, 2020

(54) MOTOR DRIVE SWITCH CONTROL WITH ADAPTIVE SLEW RATE MONITORING

(71) Applicant: TEXAS INSTRUMENTS INCORPORATED, Dallas, TX (US)

(72) Inventors: Michael Edwin Butenhoff, Minnesota City, MN (US); Rakesh Raja, Allen, TX (US); Nicholas James Oborny, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/190,784

(22) Filed: Nov. 14, 2018

(65) Prior Publication Data

US 2020/0153429 A1    May 14, 2020

(51) Int. Cl.
| | |
|---|---|
| *H02P 27/00* | (2006.01) |
| *H03K 17/687* | (2006.01) |
| *H02P 29/00* | (2016.01) |
| *H03K 7/08* | (2006.01) |

(52) U.S. Cl.
CPC ......... *H03K 17/6871* (2013.01); *H02P 27/00* (2013.01); *H02P 29/00* (2013.01); *H03K 7/08* (2013.01)

(58) Field of Classification Search
CPC .............. H02P 25/034; H03K 17/163; H03K 19/00361; H03K 17/16; H03K 4/94
See application file for complete search history.

(56) References Cited

U.S. PATENT DOCUMENTS

| | | | | |
|---|---|---|---|---|
| 5,939,909 | A | * | 8/1999 | Callahan, Jr. ............ H03K 4/00 327/108 |
| 6,069,509 | A | * | 5/2000 | Labram ................ H03K 17/163 134/112 |
| 6,084,378 | A | * | 7/2000 | Carobolante ......... H02P 25/034 318/254.2 |
| 6,222,403 | B1 | * | 4/2001 | Mitsuda ........... H03K 19/00361 326/26 |
| 6,535,035 | B2 | * | 3/2003 | Ziemer ................. G11B 19/20 327/108 |
| 6,850,383 | B1 | * | 2/2005 | Bennett ................ G11B 5/5526 360/75 |
| 8,558,583 | B2 | * | 10/2013 | Sinow ................ H03K 17/6871 327/108 |
| 2008/0238492 | A1 | * | 10/2008 | Junus ..................... H03K 5/153 327/82 |

* cited by examiner

*Primary Examiner* — Rina I Duda
(74) *Attorney, Agent, or Firm* — Ray A. King; Charles A. Brill; Frank D. Cimino (57) ABSTRACT

An electronic circuit includes a first switch driver, a second switch driver, and a switch node coupled to the first and second switch drivers, and configured to couple to a motor. The electronic circuit also includes slew rate measurement circuitry coupled to the switch node and configured to measure a slew rate of switching operations at the switch node. The electronic circuit also includes a controller coupled to the first switch driver, to the second switch driver, and to the slew rate measurement circuitry, and configured to compare a measured slew rate provided by the slew rate measurement circuitry with a target slew rate, and to selectively adjust control signals to at least one of the first and second switch drivers based on a comparison result. The first and second switch drivers are configured to drive switches to power the motor based on the control signals.

21 Claims, 5 Drawing Sheets

FIG. 5

MOTOR DRIVE SWITCH CONTROL WITH ADAPTIVE SLEW RATE MONITORING

BACKGROUND

There are various types and sizes of motors. For example, some motors are powered by a direct-current signal (DC), while other motors are powered by an alternative-current (AC) signal. The amount of power needed by the motor depends on the motor bad, which often varies over time. Various motor control or drive circuit products have been developed and are being developed to support industry uses of motors. An example motor drive circuit controls two switches coupled between a power supply and ground to provide a variable amount of power to a switch node that couples to the motor.

Providing a motor drive product with flexibility to be used in different scenarios can improve profitability, but this goal is not a trivial task. In motor drive applications, the rise and fall time (the slew rate) of the switch node affects system efficiency and electromagnetic interference (EMI) performance. Also, different designers have different design objectives. In an example automotive use of motors, longer rise/fall times (e.g., 1-3 µs) are targeted due to emissions standards and long electrical lines. In contrast, in an example industrial use of motors, shorter rise/fall times (e.g., less than 200 ns) are targeted. Previous efforts to improve motor drive circuit flexibility include a manual gate-current adjustment option to increase or decrease slew rate. For many system designers, the manual gate-current adjustment option is burdensome due to variations in each motor drive circuit and system. Efforts to improve motor drive products are ongoing.

SUMMARY

In accordance with at least one example of the disclosure, an electronic circuit comprises a first switch driver, a second switch driver, and a switch node coupled to the first and second switch drivers, and configured to couple to a motor. The electronic circuit also comprises slew rate measurement circuitry coupled to the switch node and configured to measure a slew rate of switching operations at the switch node. The electronic circuit also comprises a controller coupled to the first switch driver, to the second switch driver, and to the slew rate measurement circuitry, and configured to compare a measured slew rate provided by the slew rate measurement circuitry with a target slew rate, and to selectively adjust control signals to at least one of the first and second switch drivers based on a comparison result. The first and second switch drivers are configured to drive switches to power the motor based on the control signals.

In accordance with at least one example of the disclosure, a system comprises a switch control circuit having a first switch driver, a second switch driver, and a switch node coupled to the first and second switch drivers. The system also comprises slew rate measurement circuitry coupled to the switch node and configured to measure a slew rate of switching operations at the switch node. The system also comprises a controller coupled to the first switch driver, to the second switch driver and to the slew rate measurement circuitry, and configured to compare a measured slew rate provided by the slew rate measurement circuitry with a target slew rate, and to selectively adjust control signals to at least one of the first and second switch drivers based a comparison result, wherein the first and second switch drivers are configured to drive switches to power the motor based on the control signals.

In accordance with at least one example of the disclosure, a method comprises measuring, by a measurement circuit, a slew rate during switching operations at a switch node coupled to a motor. The method also comprises comparing, by a control circuit, the measured slew rate to a target slew rate. The method also comprises adjusting, by the control circuit, at least one switch driver output based on a result of said comparing. The method also comprises powering the motor with a power supply coupled to the motor via at least one switch controlled using the at least one switch driver output.

BRIEF DESCRIPTION OF THE DRAWINGS

For a detailed description of various examples, reference will now be made to the accompanying drawings in which.

DETAILED DESCRIPTION

Disclosed herein are motor drive switch control circuits with adaptive slew rate monitoring, and related systems and methods. In some examples, a motor drive switch control circuit with adaptive slew rate monitoring includes a first circuit for selecting a target slew rate and a second circuit for measuring a slew rate. The target slew rate and the measured slew rate are compared, and the comparison result is used to adjust switch driver operations (to increase or decrease an amount of current provided by the switch driver to a respective switch). In different examples, the target slew rate is adjustable using an analog or digital signal and related control circuit. In some examples, the second circuit supports a particular slew rate measurement window (e.g., the measurement corresponds to a 10%-90% rise or fall, the measurement corresponds to a 20%-80% rise or fall, etc.). Also, in some examples, the second circuit enables adjustments to the slew rate measurement window (e.g., the measurement window is adjusted from a 10%-90% rise or fall to another window such as 20%-80% or vice versa).

The disclosed motor drive switch control circuits with adaptive slew rate monitoring provide a flexible design that is functional even with internal component variations (e.g., components of the first circuit, the second circuit, and/or other components vary within a tolerance) and/or external component variations (e.g., variations in motors, switches, and/or other components). Such flexibility enhances the profitability of motor drive switch control circuit commercialization and facilitates system design for customers. To provide a better understanding, various motor drive switch control circuit options with adaptive slew rate monitoring, system options, and method options are described using the figures as follows.

Figure 1:
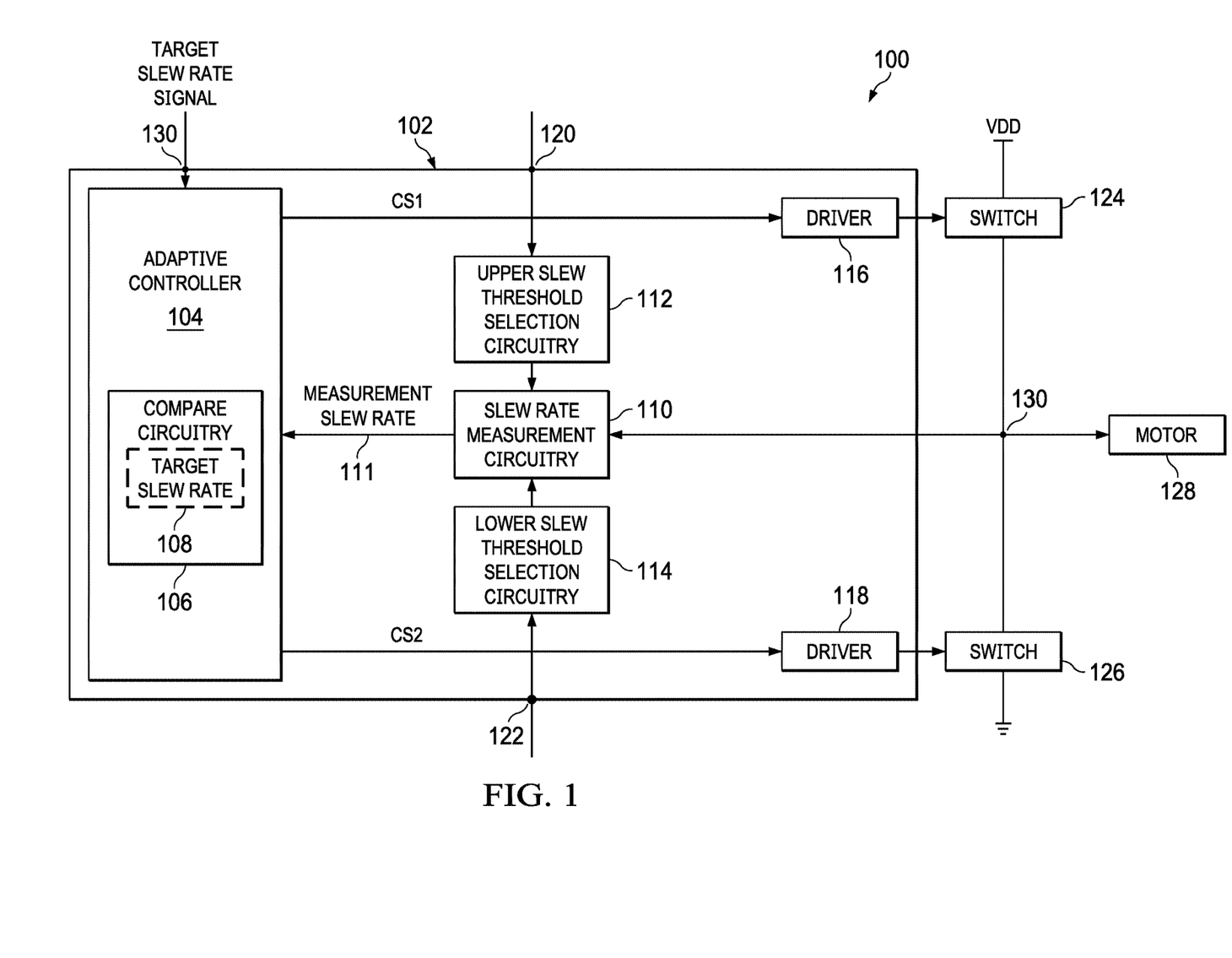
FIG. 1 is a block diagram showing a system in accordance with various examples.

FIG. 1 is a block diagram showing a system 100 in accordance with various examples. As shown, the system 100 includes a motor drive switch control circuit 102 with an adaptive controller 104. In different examples, the motor drive switch control circuit 102 is an integrated circuit (e.g., a die or chip), a multi-die module, and/or a printed circuit board (PCB) with components configured to direct switches 124 and 126 to provide power to the motor 128. More specifically, the switch 124 couples to a power supply (VDD), such that the "on-time" of the switch 124 increases power to the motor 128. Meanwhile, the switch 126 couples to ground, such that the "on-time" of the switch 126 decreases power to the motor 128. In some examples, the switches 124 and 126 are power field-effect transistors (FETs) that are external to the motor drive switch control circuit 102. In accordance with at least some examples, the adaptive controller 104 enables the slew rate at the switch node 130 to be increased or decreased based on slew rate monitoring operations as described herein.

In the example of FIG. 1, the adaptive controller 104 performs slew rate monitoring operations using compare circuitry 106 configured to compare a target slew rate 108 with a measured slew rate 111. In some examples, the target slew rate 108 is selected or adjusted using a target slew rate signal, which is provided to the motor drive switch control circuit 102 at node 130. Examples of the target slew rate signal includes a multi-bit digital signal or an analog signal that results in the target slew rate 108 being available to the compare circuitry 106.

In some examples, the adaptive controller 104 is an analog controller that stores the target slew rate 108 as a voltage level (e.g., a charge on a capacitor). In such case, the compare circuitry 106 includes a comparator configured to compare the voltage level representing the target slew rate 108 with another voltage level representing the measured slew rate 111. In other examples, the adaptive controller 104 is an analog controller that stores the target slew rate 108 as a current level. In such case, the compare circuitry 106 includes compare circuitry configured to compare the current level representing the target slew rate 108 with another current level representing the measured slew rate 111. In some examples, if the adaptive controller 104 is an analog controller, the result of the comparison by the compare circuitry 106 is an analog signal used by the adaptive controller 104 for subsequent adjustment operations. Example comparison results include: 1) an analog signal that indicates the target slew rate 108 is greater than the measured slew rate 111; 2) an analog signal that indicates the target slew rate 108 is less than the measured slew rate 111; 3) an analog signal that indicates the target slew rate 108 is greater than the measured slew rate 111 by at least a threshold amount; 4) an analog signal that indicates the target slew rate 108 is less than the measured slew rate 111 by at least a threshold amount; 5) an analog signal that indicates the difference between the target slew rate 108 and the measured slew rate 111; and 6) an analog signal that indicates the target slew rate 108 is the same as the measured slew rate 111.

In some examples, the adaptive controller 104 is a digital controller that stores the target slew rate 108 as a digital signal (e.g., a multi-bit value stored in a register). In such case, the compare circuitry 106 includes a digital comparator to compare the digital signal representing the target slew rate 108 with a digital signal representing the measured slew rate 111. In some examples, the measured slew rate 111 is determined based on a fixed clock rate and the timing of comparator outputs (to track slew start/stop times). In one example, a slew start time and a slew stop time is recorded. The measured slew rate 111 is then determined by subtracting the slew start time from the slew stop time. In another example, the number of fixed clock rate cycles between a slew start time and a slew stop time is tracked. In this example, the measured slew rate 111 is determined by converting each fixed clock rate cycle to a time value and performing adding operations (add all time values for each fixed clock rate cycle) or a multiplication (multiply the time value by the number of fixed rate clock cycles). In some examples, the slew rate measurement circuit 110 includes all components needed to determine the measured slew rate 111 as represented in FIG. 1. In other examples, the slew rate measurement circuit 110 provides slew measurement parameters to the adaptive controller 104 (e.g., a slew start trigger, a slew stop trigger, a number of clock cycles, etc.), which are used by the adaptive controller 104 to determine the measured slew rate 111.

In some examples, if the adaptive controller 104 is a digital controller, the result of the comparison by the compare circuitry 106 is a digital signal used by the adaptive controller 104 for subsequent adjustment operations. Example comparison results include: 1) a digital signal that indicates the target slew rate 108 is greater than the measured slew rate 111; 2) a digital signal that indicates the target slew rate 108 is less than the measured slew rate 111; 3) a digital signal that indicates the target slew rate 108 is greater than the measured slew rate 111 by at least a threshold amount; 4) a digital signal that indicates the target slew rate 108 is less than the measured slew rate 111 by at least a threshold amount; 5) a digital signal that indicates the difference between the target slew rate 108 and the measured slew rate 111; and 6) a digital signal that indicates the target slew rate 108 is the same as the measured slew rate 111. In some examples, the comparison result is used to adjust a count value of a counter, where the count value is used by the adaptive controller 104 to provide subsequent control signals.

In some examples, the result of the comparison of the target slew rate 108 and the measured slew rate 111 is used by the adaptive controller 104 to provide control signals (CS1 and CS2) for the drivers 116 and 118. For example, if the target slew rate 108 and the measured slew rate 111 match to within a threshold tolerance, CS1 and CS2 do not change. On the other hand, if the target slew rate 108 is greater than the measured slew rate 111, CS1 and/or CS2 are adjusted to increase the slew rate at the switch node 130. Meanwhile, if the target slew rate 108 is less than the measured slew rate 111, CS1 and/or CS2 are adjusted to decrease the slew rate at the switch node 130.

In some examples, in a rising slew scenario where an increased slew rate is desired, CS1 can direct the driver 116 to increase current to the switch 124, which causes an increased rising slew rate. In a rising slew scenario where a decreased slew rate is desired, CS1 can direct the driver 116 to decrease current to the switch 124, which causes a decreased rising slew rate. In a falling slew scenario where an increased slew rate is desired, CS2 can direct the driver 118 to increase current to the switch 126, which causes an increased falling slew rate. In a falling slew scenario where a decreased slew rate is desired, CS2 can direct the driver 118 to decrease current to the switch 126, which causes a decreased falling slew rate.

In different examples, the amount of increase or decrease per adjustment varies. In some examples, the adaptive controller 104 directs the driver 116 and/or the driver 118 based on the comparison results of the compare circuitry 106 such that slew adjustments are fixed rate adjustments (e.g., each adjustment corresponds to a 1% adjustment, a 2% adjustment, or other fixed rate adjustment of the slew rate or related drive signals provided to the switch 124 and/or switch 126). In other examples, the adaptive controller 104 directs the driver 116 and/or the driver 118 based on the comparison results of the compare circuitry 106 such that slew adjustments are dynamic rate adjustments (e.g., adjustments depend on the amount of difference between the target slew rate and the measured slew rate). With dynamic rate adjustments, the slew rate at the switch node 130 will more quickly align with the target slew rate. In some examples, the adaptive controller 104 directs the driver 116 and/or the driver 118 based on the comparison results of the compare circuitry 106 such that the slew rate at the switch node 130 aligns with the target slew rate without surpassing the target slew rate in the direction of adjustment. In other examples, the adaptive controller 104 directs the driver 116 and/or the driver 118 based on the comparison results of the compare circuitry 106 such that the slew rate at the switch node 130 oscillates around the target slew rate.

In the system 100, the measured slew rate 111 is provided by slew rate measurement circuitry 110 coupled to the switch node 130. In other examples, the measured slew rate 111 is determined by the adaptive controller 104 based on values (e.g., the timing of upper and lower slew threshold transitions) provided by the slew rate measurement circuitry 110. In one example, the slew rate measurement circuitry 110 compares the signal at the switch node 130 to upper and lower slew thresholds. In the example of FIG. 1, the upper slew threshold is selected by upper slew threshold selection circuitry 112, and the lower slew threshold is selected by lower slew threshold selection circuitry 114. In some examples, the upper slew threshold selection circuit 112 and the lower slew threshold selection circuit 114 provide fixed upper and lower slew thresholds. In one example, the upper slew threshold is fixed at 90%, 80%, or another value, while the lower slew threshold is fixed at 10%, 20%, or another value. In some examples, to provide fixed upper and lower slew thresholds, the upper and lower slew threshold selection circuits 112 and 114 include at least three resistors in series between a power supply node (e.g., node 120) and a ground node (e.g., node 122). In the example of FIG. 1, the power supply node 120 couples to the same power supply (VDD) as the switch 124. In other examples, the power supply node 120 couples to VDD through a Kelvin connection.

In some examples, the upper slew threshold selection circuit 112 and the lower slew threshold selection circuit 114 provide adjustable upper and lower slew thresholds. In one example, the upper slew threshold is adjustable to 90%, 80%, or another value, while the lower slew threshold is adjustable to 10%, 20%, or another value. In some examples, to provide adjustable upper and lower slew thresholds, the upper and lower slew threshold selection circuits 112 and 114 each include a digital-to-analog converter (DAC). Additionally or alternatively, the upper and lower slew threshold selection circuits 112 and 114 include variable resistors (e.g., switched-capacitor resistors) to provide adjustable upper and lower slew thresholds.

Figure 2:
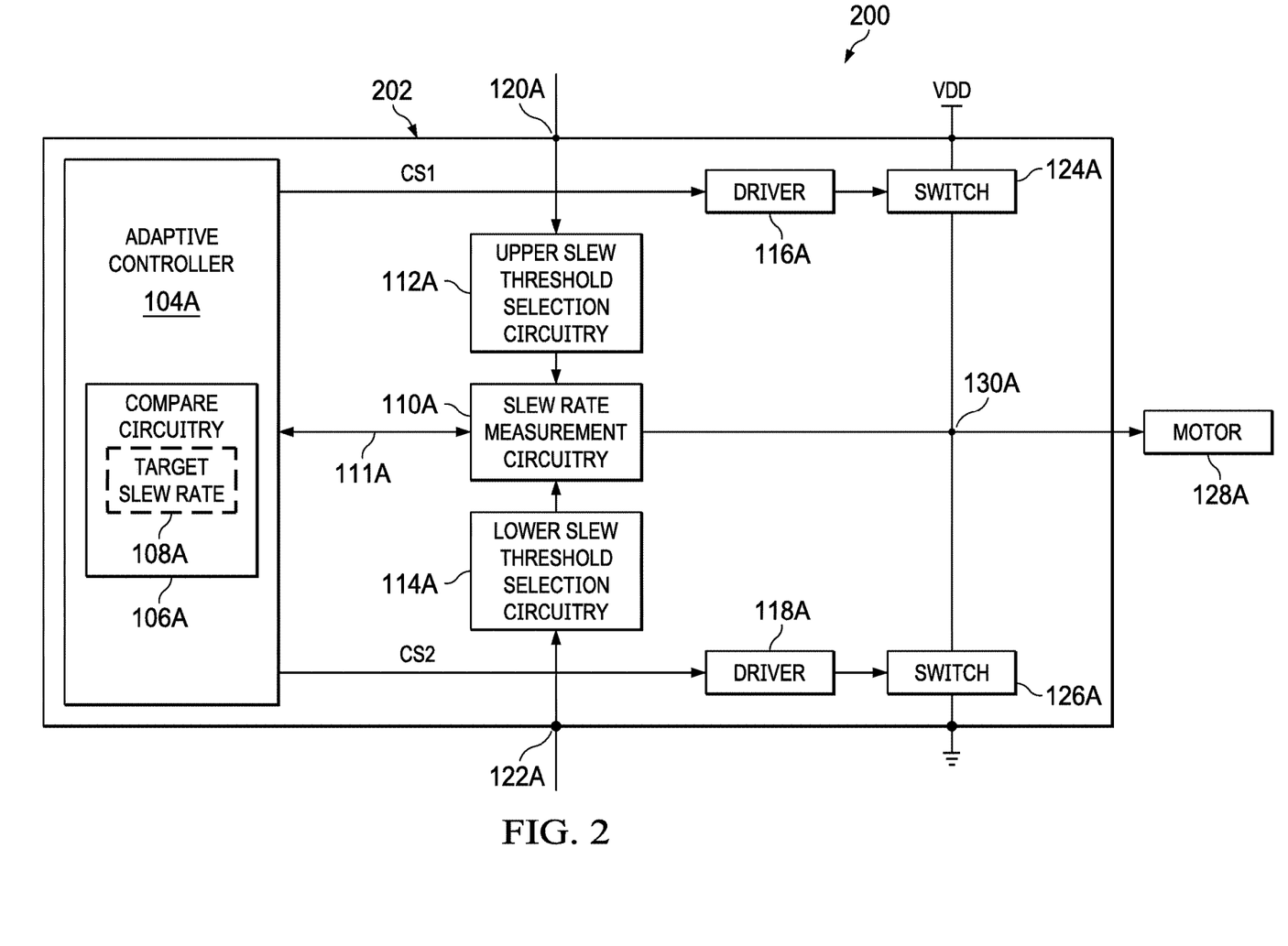
FIG. 2 is a block diagram showing another system in accordance with various examples.

FIG. 2 is a block diagram showing another system 200 in accordance with various examples. As shown in FIG. 2, the system 200 includes an electronic circuit 202 (e.g., an integrated circuit, a multi-die module, or printed circuit board with components) with many of the same type of components introduced in FIG. 1. More specifically, the adaptive controller 104A of FIG. 2 is an example of the adaptive controller 104 in FIG. 1, the compare circuitry 106A in FIG. 2 is an example of the compare circuitry 106 in FIG. 1, and the slew rate measurement circuitry 110A in FIG. 2 is an example of the slew rate measurement circuitry 110 in FIG. 1. Also, the upper and lower slew threshold selection circuitry 112A and 114A in FIG. 2 are examples of the upper and lower slew threshold selection circuitry 112 and 114 in FIG. 1. Also, the power supply node 120A in FIG. 2 is an example of the power supply node 120 in FIG. 1. In the example of FIG. 2, the power supply node 120A couples to the same power supply (VDD) as the switch 124A. In other examples, the power supply node 120A couples to VDD through a Kelvin connection. Also, the ground node 122A in FIG. 2 is an example of the ground node 122 in FIG. 1. Also, the drivers 116A and 118A in FIG. 2 are examples of the drivers 116 and 118 in FIG. 1. Also, the switches 124A and 126A are examples of the switches 124 and 126 in FIG. 1. Also, the switch node 130A in FIG. 2 is an example of the switch node 130 in FIG. 1. Also, the motor 128A is an example of the motor 128 in FIG. 1.

In FIG. 2, the system 200 represents a unit or product, where power to the motor 128A is provided based on the operations of the switches 124A and 126A, which are included with the electronic circuit 202. For the system 200, the switches 124A and 126A operate based on drive signals provided by the drivers 116A and 118A, where the timing and/or magnitude of the drive signals provided by the drivers 116A and 118A is determined by the adaptive controller 104A. In at least some examples, the adaptive controller 104A provides control signals to the drivers 116A and 118A based on slew rate monitoring operations as described herein. For example, the slew rate monitoring operations performed by the adaptive controller 104A involves a comparison of a target slew rate 108A and a measured slew rate 111A. In different examples, the various options described for the target slew rate 108, the measured slew rate 111, the compare circuitry 106, the slew rate measurement circuitry 110, the upper slew threshold selection circuitry 112, and the lower slew threshold selection circuitry 114 in FIG. 1 are available for the target slew rate 108A, the measured slew rate 111A, the compare circuitry 106A, the slew rate measurement circuitry 110A, the upper slew threshold selection circuitry 112A, and the lower slew threshold selection circuitry 114A of FIG. 2.

Figure 3:
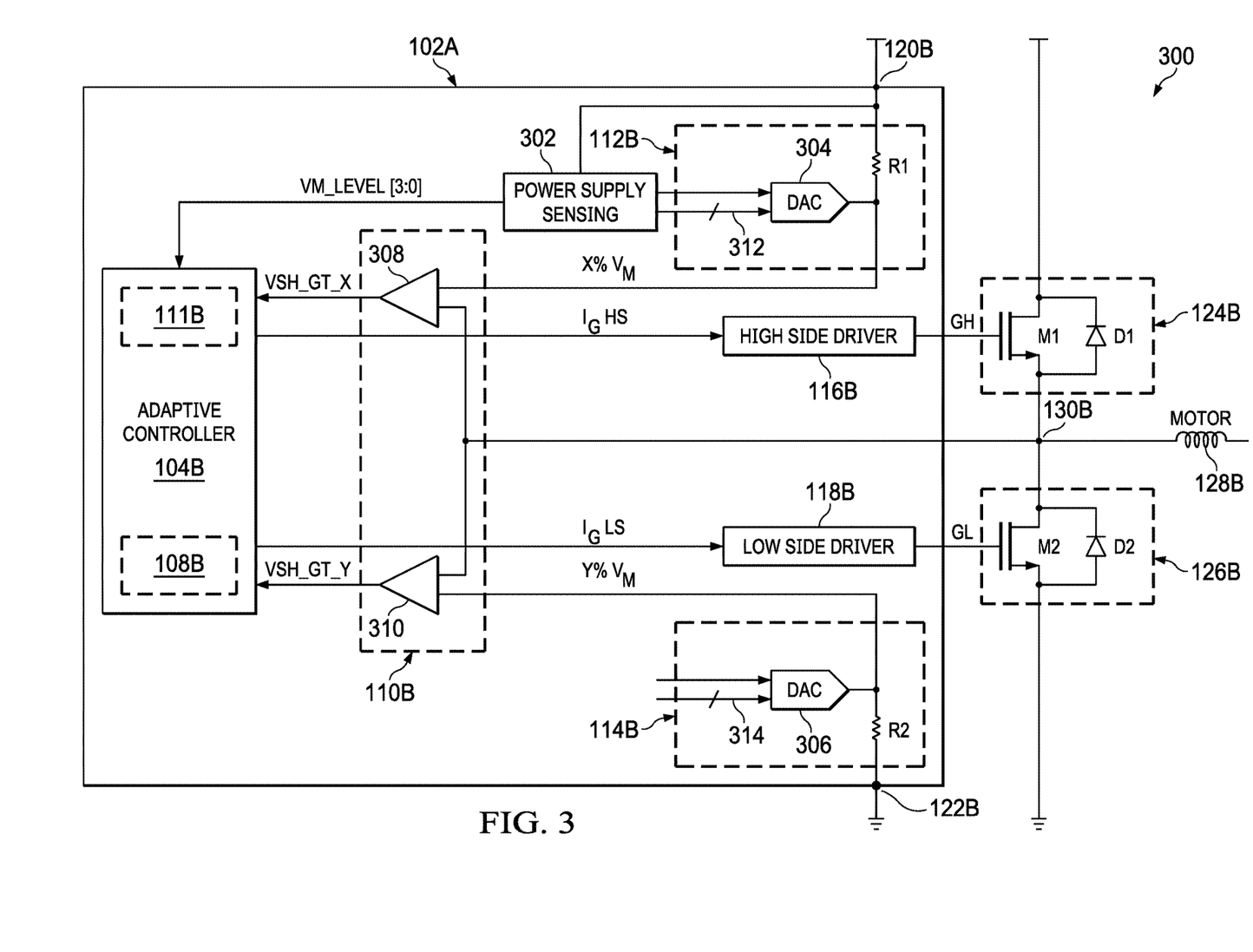
FIG. 3 is a schematic diagram showing a system in accordance with various examples.

FIG. 3 is a schematic diagram showing a system 300 in accordance with various examples. As shown in FIG. 3, the system 300 includes many of the same type of components introduced in FIG. 1. More specifically, the adaptive controller 104B of FIG. 3 is an example of the adaptive controller 104 in FIG. 1 and the slew rate measurement circuitry 110B in FIG. 3 is an example of the slew rate measurement circuitry 110 in FIG. 1. Also, the upper and lower slew threshold selection circuitry 112B and 114B in FIG. 3 are examples of the upper and lower slew threshold selection circuitry 112 and 114 in FIG. 1. Also, the power supply node 120B in FIG. 3 is an example of the power supply node 120 in FIG. 1. In the example of FIG. 3, the power supply node 120B couples to the same power supply (VDD) as the switch 124B. In other examples, the power supply node 120B couples to VDD through a Kelvin connection. Also, the ground node 122B in FIG. 3 is an example of the ground node 122 in FIG. 1. Also, the drivers 116B and 118B in FIG. 3 are examples of the drivers 116 and 118 in FIG. 1. Also, the switches 124B and 126B are examples of the switches 124 and 126 in FIG. 1. Also, the switch node 130B in FIG. 3 is an example of the switch node 130 in FIG. 1. Also, the motor 128B in FIG. 3 is an example of the motor 128 in FIG. 1.

In FIG. 3, the system 300 includes a motor drive switch control circuit 102A, which is an example of the motor drive switch control circuit 102 of FIG. 1. In different examples, the motor drive switch control circuit 102A is an integrated circuit (e.g., a die or chip), a multi-die module, and/or a PCB with components configured to direct switches 124B and 126B to provide power to the motor 128B. More specifically, the switch 124B couples to a power supply, such that the "on-time" of and/or the amount of current flow through the switch 124B increases power to the motor 128B. Meanwhile, the switch 126B couples to ground, such that the "on-time" and/or the amount of current flow through of the switch 126B decreases power to the motor 128B. In some examples, the switches 124B and 126B are power FETs that are external to the motor drive switch control circuit 102A. In accordance with at least some examples, the adaptive controller 104B enables the slew rate at the switch node 130B to be increased or decreased based on slew rate monitoring operations as described herein.

For example, the slew rate monitoring operations performed by the adaptive controller 104B involves a comparison of a target slew rate 108B and a measured slew rate 111B. In different examples, the various options described for the target slew rate 108, the measured slew rate 111, the compare circuitry 106, and the slew rate measurement circuitry 110 in FIG. 1 are available for the target slew rate 108B, the measured slew rate 111B, and the slew rate measurement circuitry 110B of FIG. 3. Without limitation to other examples, the adaptive controller 104B of FIG. 3 represents a digital controller.

In the example of system 300, the upper slew threshold selection circuitry 112B comprises a resistor (R1) coupled between a power supply node 120B and the slew rate measurement circuitry 110B. More specifically, the slew rate measurement circuitry 110B includes a first comparator 308 with its reference input coupled to R1 and to a DAC 304. The DAC 304 provides an adjustable signal to the reference input of the comparator 308 to enable adjustment of the upper slew threshold. In FIG. 3, the upper slew threshold is expressed as X % of $V_M$ (e.g., 80%, 90%, etc., of the power supply signal, $V_M$, at the power supply node 120B). In some examples, the DAC 304 receives a signal from a power supply sensing circuit 302, which is coupled to the power supply node 120B. The DAC 304 also receives a digital control signal 312. In operation, the DAC 304 provides an adjustable signal to the reference input of the comparator 308 based on the output of the power supply sensing circuit 302 and the digital control signal 312. In the example of FIG. 3, the power supply sensing signal 302 also provides an output signal (labeled VM_LEVEL in FIG. 3) to the adaptive controller 104B. In some examples, the value of VM_LEVEL is used to set or adjust the target slew rate 108B.

In some examples, VM_LEVEL indicates a range for the supply voltage (e.g., 5-10V or 10-15V or 15-20V, etc.). Accordingly, even if the supply voltage changes, the target slew rate 108B is adjusted as needed. As an example, a slew rate of 10V/us would mean rise/fall time of 1 us when the supply voltage is 10V. In contrast, is the supply voltage is 20V, the rise/fall time would need to be increased to 2 us. Accordingly, in some examples, the adaptive controller 104B maintains the efficiency/EMI tradeoff even while the supply voltage is changing by dynamically adjusting the rise/fall time to maintain the same slew rate.

In the example of system 300, the lower slew threshold selection circuitry 114B comprises a resistor (R2) coupled between a ground node 122B and the slew rate measurement circuitry 110B. More specifically, the slew rate measurement circuitry 110B includes a second comparator 310 with its reference input coupled to R2 and to a DAC 306. The DAC 306 provides an adjustable signal to the reference input of the comparator 310 to enable adjustment of the lower slew threshold. In FIG. 3, the lower slew threshold is expressed as Y % of $V_M$ (e.g., 20%, 10%, etc., of the power supply signal, $V_M$, at the power supply node 120B). In some examples, the DAC 306 receives a signal from the power supply sensing circuit 302, which is coupled to the power supply node 120B. The DAC 306 also receives a digital control signal 314. In operation, the DAC 306 provides an adjustable signal to the reference input of the comparator 310 based on the output of the power supply sensing circuit 302 and the digital control signal 314. In different examples, the adaptive controller 104B provides control signals to the drivers 116B and 118B based on a comparison of the target slew rate 108B and a measured slew rate 111B, where the target slew rate 108B and/or the measured slew rate 111B is adjustable (e.g., based on the power supply level and/or other control signals).

As desired, different versions of the motor drive switch control circuit 102A use different fixed values for R1 and R2. Also, in some examples, the power supply sensing circuit 302 is omitted. Also, in different examples, the adaptive controller 104B provides control signals to the drivers 116B and 118B based on a comparison of the target slew rate 108B and a measured slew rate 111B, where the target slew rate 108B and/or the measured slew rate 111B is adjustable (e.g., based on the power supply level and/or other control signals).

In a rising slew scenario, the output of the comparator 310 will transition (e.g., VSH_GT_Y transitions from low-to-high) when the signal at the switch node 130B crosses the lower slew threshold set by the reference input of the comparator 310. This transition in the output of the comparator 310 is tracked by the adaptive controller 104B. In the rising slew scenario, the output of the comparator 308 will transition (e.g., VSH_GT_X transitions from low-to-high) when the signal at the switch node 130B crosses the upper slew threshold set by the reference input of the comparator 308. This transition in the output of the comparator 308 is tracked by the adaptive controller 104B. In FIG. 3, the timing of the rising slew transitions of the comparators 310 and 308 are used by the adaptive controller 104B (or circuitry external to the adaptive controller 104B) to determine the measured slew rate 111B. In some examples, circuitry (e.g., clocks, counters, registers, etc.) of the adaptive controller 104B tracks the rising edge timing of VSH_GT_Y and VSH_GT_X and measures the difference between the rising edge timing of VSH_GT_Y and VSH_GT_X to determine the measured slew rate 111B.

In a falling slew scenario, the output of the comparator 308 will transition (e.g., VSH_GT_X transitions from high-to-low) when the signal at the switch node 130B crosses the upper slew threshold set by the reference input of the comparator 308. This transition in the output of the comparator 308 is tracked by the adaptive controller 104B. In the falling slew scenario, the output of the comparator 310 will transition (e.g., VSH_GT_Y transitions from high-to-low) when the signal at the switch node 130B crosses the lower slew threshold set by the reference input of the comparator 310. This transition in the output of the comparator 310 is tracked by the adaptive controller 104B. In FIG. 3, the timing of the falling slew transitions of the comparators 310 and 308 are used by the adaptive controller 104B (or circuitry external to the adaptive controller 104B) to determine the measured slew rate 111B. In some examples, circuitry (e.g., clocks, counters, registers, etc.) of the adaptive controller 104B tracks the falling edge timing of VSH_GT_Y and VSH_GT_X and measures the difference between the falling edge timing of VSH_GT_Y and VSH_GT_X to determine the measured slew rate 111B.

In either rising slew or falling slew scenarios, the measured slew rate 111B is compared with the target slew rate 108B. Subsequently, the adaptive controller 104B uses the comparison result to provide control signals (labeled "$I_G$ HS" and "$I_G$ LS") to the drivers 116B and 118B. In response to changes to $I_G$ HS, the driver 116B adjusts a drive signal to the switch 124B. More specifically, the switch 124B comprises a transistor (M1) with its control terminal coupled to the driver 116B, a first current terminal coupled to a power supply, and a second current terminal coupled to the switch node 130B. Also, a diode (D1) couples across the first and second current terminals of M1. Meanwhile, in response to changes to $I_G$ LS, the driver 118B adjusts a drive signal to the switch 126B. More specifically, the switch 126B comprises a transistor (M2) with its control terminal coupled to the driver 118B, a first current terminal coupled to the switch node 130B, and a second current terminal coupled to ground. Also, a diode (D2) couples across the first and second current terminals of M2. During operations, the "on-time" and/or the amount of current flow for M1 and M2 (determined by $I_G$ HS and $I_G$ LS inputs to the drivers 116B and 118B, and subsequently the GH and GL drive signals from the drivers 116B and 118B) determines the amount of power provided to the motor 128B. In addition, the "on-time" and/or the amount of current flow for M1 and M2 are controlled to adjust the slew rate of transitions at the switch node 130B based on slew rate monitoring operations as described herein.

Figure 4:
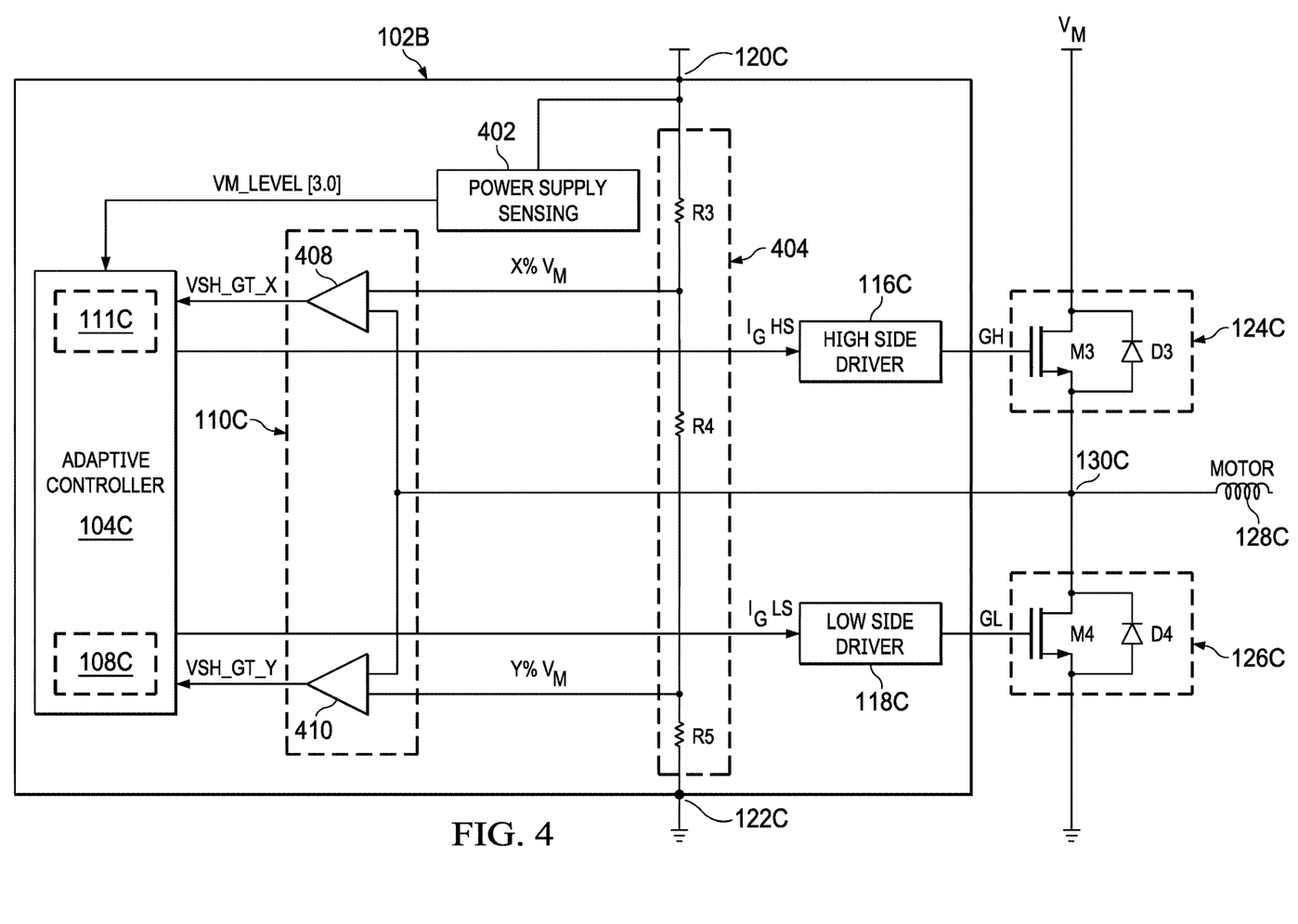
FIG. 4 is a schematic diagram showing another system in accordance with various examples.

FIG. 4 is a schematic diagram showing another system 400 in accordance with various examples. As shown in FIG. 4, the system 400 includes many of the same type of components introduced in FIG. 1. More specifically, the adaptive controller 104C of FIG. 4 is an example of the adaptive controller 104 in FIG. 1 and the slew rate measurement circuitry 110C in FIG. 4 is an example of the slew rate measurement circuitry 110 in FIG. 1. Also, the upper and lower slew threshold selection circuitry 112C and 114C in FIG. 4 are examples of the upper and lower slew threshold selection circuitry 112 and 114 in FIG. 1. Also, the power supply node 120C in FIG. 4 is an example of the power supply node 120 in FIG. 1. In the example of FIG. 4, the power supply node 120C couples to the same power supply (VDD) as the switch 124C. In other examples, the power supply node 120C couples to VDD through a Kelvin connection. Also, the ground node 122C in FIG. 4 is an example of the ground node 122 in FIG. 1. Also, the drivers 116C and 118C in FIG. 4 are examples of the drivers 116 and 118 in FIG. 1. Also, the switches 124C and 126C are examples of the switches 124 and 126 in FIG. 1. Also, the switch node 130C in FIG. 4 is an example of the switch node 130 in FIG. 1. Also, the motor 128C in FIG. 4 is an example of the motor 128 in FIG. 1.

In FIG. 4, the system 400 includes a motor drive switch control circuit 102B, which is an example of the motor drive switch control circuit 102 of FIG. 1. In different examples, the motor drive switch control circuit 102B is an integrated circuit (e.g., a die or chip), a multi-die module, and/or a PCB with components configured to direct switches 124C and 126C to provide power to the motor 128C. More specifically, the switch 124C couples to a power supply, such that the "on-time" of and/or the amount of current flow through the switch 124C increases power to the motor 128C. Meanwhile, the switch 126C couples to ground, such that "on-time" of and/or the amount of current flow through the switch 126C decreases power to the motor 128C. In some examples, the switches 124C and 126C are power FETs that are external to the motor drive switch control circuit 102B. In accordance with at least some examples, the adaptive controller 104C enables the slew rate at the switch node 130C to be increased or decreased based on slew rate monitoring operations as described herein.

In the example of FIG. 4, the power supply sensing signal 402 provides an output signal (labeled VM_LEVEL in FIG. 4) to the adaptive controller 104C. In some examples, the value of VM_LEVEL is used to set or adjust the target slew rate 108C. In some examples, VM_LEVEL indicates a range for the supply voltage (e.g., 5-10V or 10-15V or 15-20V, etc.). Accordingly, even if the supply voltage changes, the target slew rate 108C is adjusted as needed. As an example, a slew rate of 10V/us would mean rise/fall time of 1 us when the supply voltage is 10V. In contrast, is the supply voltage is 20V, the rise/fall time would need to be increased to 2 us. Accordingly, in some examples, the adaptive controller 104C maintains the efficiency/EMI tradeoff even while the supply voltage is changing by dynamically adjusting the rise/fall time to maintain the same slew rate.

In some examples, the slew rate monitoring operations performed by the adaptive controller 104C involves a comparison of a target slew rate 108C and a measured slew rate 111C. In different examples, the various options described for the target slew rate 108, the measured slew rate 111, the compare circuitry 106, and the slew rate measurement circuitry 110 in FIG. 1 are available for the target slew rate 108C, the measured slew rate 111C, and the slew rate measurement circuitry 110C of FIG. 4. Without limitation to other examples, the adaptive controller 104C of FIG. 4 represents a digital controller.

In the example of system 400, slew threshold selection circuitry 404 includes components for both upper and lower slew threshold selection. More specifically, the slew threshold selection circuitry 404 includes three resistors (R3, R4, R5) in series between the power supply node 120C and the ground node 122C, where the values of $V_M$, R3, R4, and R5 determine the signals provided to the slew rate measurement circuitry 110C. More specifically, the slew rate measurement circuitry 110C includes a first comparator 408 with its reference input coupled between R3 and R4. In FIG. 4, the upper slew threshold is fixed based on the values for $V_M$, R3, R4, and R5 and is expressed as X % of $V_M$ (e.g., 80%, 90%, etc., of the power supply signal, $V_M$, at the power supply node 120C). In the example of system 400, the slew rate measurement circuitry 110C also includes a second comparator 410 with its reference input coupled between R4 and R5. In FIG. 4, the lower slew threshold is fixed based on the values for $V_M$, R3, R4, and R5 and is expressed as Y % of $V_M$ (e.g., 20%, 10%, etc., of the power supply signal, $V_M$, at the power supply node 120C).

As desired, different versions of the motor drive switch control circuit 102B use different fixed values for R3, R4, and R5. Also, in some examples, the power supply sensing circuit 402 is omitted. In such case, the target slew rate 108C used by the adaptive controller 104C is fixed or is adjustable (e.g., based on user input control signal or another control signal). In other examples, R3, R4, and R5 are replaced with variable resistors, where adjustments to one or more of the variable resistors are based on the output of the power supply sensing circuit 402. In different examples, the adaptive controller 104C provides control signals to the drivers 116C and 118C based on a comparison of the target slew rate 108C and a measured slew rate 111C, where the target slew rate 108C and/or the measured slew rate 111C is adjustable (e.g., based on the power supply level and/or other control signals).

In a rising slew scenario, the output of the comparator 410 will transition (e.g., VSH_GT_Y transitions from low-to-high) when the signal at the switch node 130C crosses the lower slew threshold set by the reference input of the comparator 410. This transition in the output of the comparator 410 is tracked by the adaptive controller 104C. In the rising slew scenario, the output of the comparator 408 will transition (e.g., VSH_GT_X transitions from low-to-high) when the signal at the switch node 130C crosses the upper slew threshold set by the reference input of the comparator 408. This transition in the output of the comparator 408 is tracked by the adaptive controller 104C. In FIG. 4, the timing of the rising slew transitions of the comparators 410 and 408 are used by the adaptive controller 104C (or circuitry external to the adaptive controller 104C) to determine the measured slew rate 111C.

In a falling slew scenario, the output of the comparator 408 will transition (e.g., VSH_GT_X transitions from high-to-low) when the signal at the switch node 130C crosses the upper slew threshold set by the reference input of the comparator 408. This transition in the output of the comparator 408 is tracked by the adaptive controller 104C. In the falling slew scenario, the output of the comparator 410 will transition (e.g., VSH_GT_Y transitions from high-to-low) when the signal at the switch node 130C crosses the lower slew threshold set by the reference input of the comparator 410. This transition in the output of the comparator 410 is tracked by the adaptive controller 104C. In FIG. 4, the timing of the falling slew transitions of the comparators 410 and 408 are used by the adaptive controller 104C (or circuitry external to the adaptive controller 104C) to determine the measured slew rate 111B.

In either rising slew or falling slew scenarios, the measured slew rate 111C is compared with the target slew rate 108C. Subsequently, the adaptive controller 104C uses the comparison result to provide control signals (labeled "$I_G$ HS" and "$I_G$ LS") to the drivers 116C and 118C. In response to changes to $I_G$ HS, the driver 116C adjusts a drive signal to the switch 124C. More specifically, the switch 124C comprises a transistor (M3) with its control terminal coupled to the driver 116C, a first current terminal coupled to a power supply node, and a second current terminal coupled to the switch node 130C. Also, a diode (D3) couples across the first and second current terminals of M3. Meanwhile, in response to changes to $I_G$ LS, the driver 118C adjusts a drive signal to the switch 126C. More specifically, the switch 126C comprises a transistor (M4) with its control terminal coupled to the driver 116C, a first current terminal coupled to a switch node 130C, and a second current terminal coupled to a ground node. Also, a diode (D4) couples across the first and second current terminals of M4. During operations, the "on-time" and/or the amount of current flow for M3 and M4 (determined by $I_G$ HS and $I_G$ LS inputs to the drivers 116C and 118C, and the GH and GL drive signals from the drivers 116C and 118C) determines the amount of power provided to the motor 128C. In addition, the "on-time" and/or the amount of current flow for M3 and M4 are controlled to adjust the slew rate of transitions at the switch node 130C based on slew rate monitoring operations as described herein.

Figure 5:
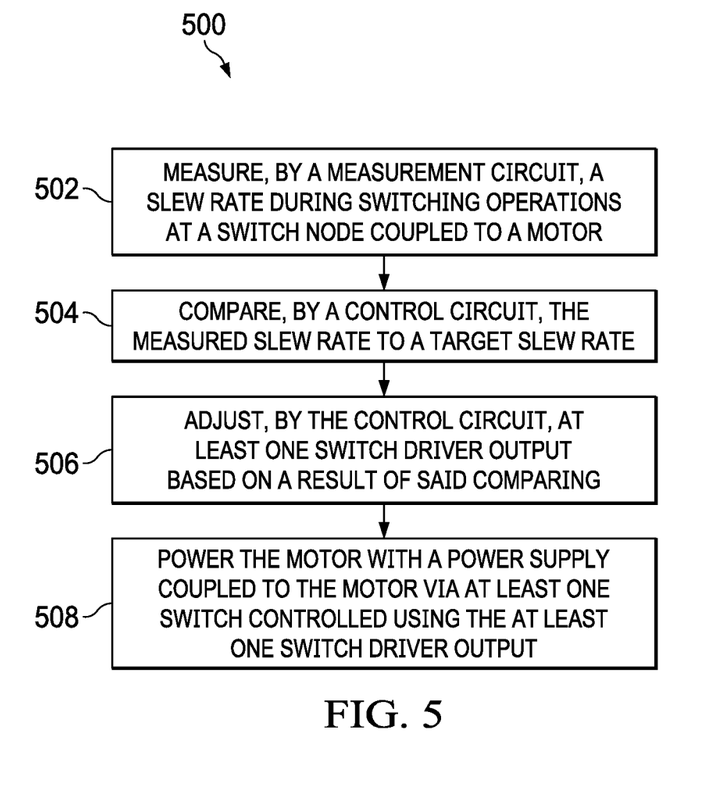
FIG. 5 is a flow chart showing a method in accordance with various examples.

FIG. 5 is a flow chart showing a method 500 in accordance with various examples. As shown, the method 500 comprises measuring, by a measurement circuit (e.g., the slew rate measurement circuitry 110 of FIG. 1, or related options in FIG. 2, 3, or 4), a slew rate during switching operations at a switch node (e.g., the switch node 130 in FIG. 1, or related options in FIG. 2, 3, or 4) coupled to a motor (e.g., motor 128 in FIG. 1, or related options in FIG. 2, 3, or 4) at block 502. At block 504, a control circuit (e.g., the adaptive controller 104 in FIG. 1, or related options in FIG. 2, 3, or 4) compares the measured slew rate (e.g., the measured slew rate 111 in FIG. 1, or related options in FIG. 2, 3, or 4) to a target slew rate (e.g., the target slew rate 108 in FIG. 1, or related options in FIG. 2, 3, or 4). At block 506, the control circuit adjusts at least one switch driver output (e.g., GH and GL in FIGS. 3 and 4) based on the comparing operations of block 504. In some examples, the control circuit provides control signals (e.g., CS1 and CS2 in FIGS. 1 and 2, or $I_G$ HS and $I_G$ LS in FIGS. 3 and 4) to respective drivers to adjust at least one switch driver output (e.g., GH and GL in FIGS. 3 and 4), where the control signals (e.g., CS1 and CS2 in FIGS. 1 and 2, or $I_G$ HS or $I_G$ LS in FIGS. 3 and 4) are selected based on the comparison operations of block 504. At block 508, the motor is powered with a power supply (VDD in FIGS. 1 and 2, or $V_M$ in FIGS. 3 and 4) coupled to the motor via at least one switch (e.g., the switches 124 and 126 in FIG. 1, or related options in FIG. 2, 3, or 4) controlled using the at least one switch driver output.

In some examples, the method 500 also comprises adjusting the target slew rate using at least one analog control signal. In some examples, the method 500 also comprises adjusting the target slew rate using at least one digital control signal. In some examples, the method 500 also comprises adjusting upper and lower slew thresholds used for measuring the slew rate.

Certain terms have been used throughout this description and claims to refer to particular system components. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:
1. An electronic circuit that comprises:
a first switch driver having an input, and having an output adapted to be coupled to a control terminal of a first switch;
a second switch driver having an input, and having an output adapted to be coupled to a control terminal of a second switch;
a switch node coupled to a current terminal of the first switch and to a current terminal of the second switch, and adapted to be coupled to a motor;

slew rate measurement circuitry that includes:
a first slew rate comparator having an output, a first input coupled to the switch node, and a second input coupled to a first reference voltage corresponding to an upper slew threshold that is adjustable; and
a second slew rate comparator having an output, a first input coupled to the switch node, and a second input coupled to a second reference voltage corresponding to a lower slew threshold that is adjustable; and
a controller having a first output coupled to the input of the first switch driver, a second output coupled to the input of the second switch driver, a first input coupled to the output of the first slew rate comparator, and a second input coupled to the output of the second slew rate comparator, and configured to selectively adjust control signals to the first and second switch drivers based on the output of the first slew rate comparator and second slew rate comparator, respectively.

2. The electronic circuit of claim 1, wherein the controller includes an analog circuit with a first capacitor that stores a first charge based on the measured slew rate, and a target slew circuit that provides a second charge based on the target slew rate, wherein the first and second charges are compared to determine the control signals.

3. The electronic circuit of claim 1, wherein the controller includes a digital circuit configured to use a fixed clock rate to determine the measured slew rate.

4. The electronic circuit of claim 3, wherein the controller includes a register configured to store a multi-bit value representing the target slew rate, and a counter configured to store a count value indicative of the comparison result.

5. The electronic circuit of claim 1, further including a slew threshold selection circuit.

6. The electronic circuit of claim 5, wherein the slew threshold selection circuit includes a first resistor, a second resistor, and a third resistor coupled in series between a voltage supply node and a ground node.

7. The electronic circuit of claim 6, wherein at least one of the first resistor, the second resistor, and the third resistor is a variable resistor.

8. The electronic circuit of claim 5, wherein the slew threshold selection circuit includes a first digital-to-analog converter (DAC) and a second DAC, wherein the first and second DACs are configured to provide adjustable upper and lower slew thresholds to the slew rate measurement circuitry.

9. The electronic circuit of claim 1, further including a power supply sensing circuit, wherein an output of the power supply sensing circuit is used to adjust the target slew rate.

10. A system that comprises:
a switch control circuit having:
a first switch driver having an input and having an output coupled to a control terminal of a first switch;
a second switch driver having an input and having an output coupled to a control terminal of a second switch;
a switch node coupled to a current terminal of the first switch driver and a current terminal of the second switch driver;
slew rate measurement circuitry that includes a first slew rate comparator having an output, a first input coupled to the switch node, and a second input coupled to a first reference voltage corresponding to an upper slew threshold that is adjustable, and a second slew rate comparator having an output, a first input coupled to the switch node, and a second input coupled to a second reference voltage corresponding to a lower slew threshold that is adjustable; and
a controller having a first output coupled to the input of the first switch driver, a second output coupled to the input of the second switch driver, a first input coupled to the output of the first slew rate comparator, and a second input coupled to the output of the second slew rate comparator, and configured to selectively adjust control signals to the first and second switch drivers based on the outputs of the first and second slew rate comparators, respectively.

11. The system of claim 10, further including a motor coupled to the switch node, and a power supply sensing circuit, wherein an output of the power supply sensing circuit is used to adjust the target slew rate.

12. The system of claim 10, wherein the target slew rate is adjustable using at least one analog control signal.

13. The system of claim 10, wherein the target slew rate is adjustable using at least one digital control signal.

14. The system of claim 10, wherein upper and lower slew thresholds used by the slew rate measurement circuitry are fixed.

15. The system of claim 10, wherein upper and lower slew thresholds used by the slew rate measurement circuitry are adjustable.

16. The system of claim 10, wherein the first and second switches are power field-effect transistors (FETs).

17. A method that comprises:
measuring, by a measurement circuit having the means to adjust upper and lower threshold voltages, a lower slew rate and an upper slew rate during switching operations at a switch node that is configured to be coupled to a motor;
comparing, by a control circuit, the measured slew rate to a target slew rate generated based on an output of a power supply sensing circuit and a reference input signal, resulting in a comparison output;
adjusting, by the control circuit, at least one switch driver output based on the comparison output; and
powering the motor with a power supply coupled to the motor via at least one switch controlled using the at least one switch driver output.

18. The method of claim 17, further including adjusting the target slew rate using at least one analog control signal.

19. The method of claim 17, further including adjusting the target slew rate using at least one digital control signal.

20. The method of claim 17, further including adjusting upper and lower slew thresholds used for measuring the slew rate.

21. The method of claim 17, further including adjusting the target slew rate based on a monitored power supply level.

* * * * *